(12) United States Patent
Schultz

(10) Patent No.: US 7,430,703 B1
(45) Date of Patent: Sep. 30, 2008

(54) ERROR CORRECTION FOR MULTIPLE WORD READ

(75) Inventor: David P. Schultz, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 604 days.

(21) Appl. No.: 11/135,979

(22) Filed: May 24, 2005

(51) Int. Cl.
*G11C 29/00* (2006.01)

(52) U.S. Cl. ...................................... 714/773

(58) Field of Classification Search ................. 714/773
See application file for complete search history.

(56) References Cited

U.S. PATENT DOCUMENTS

| | | | | |
|---|---|---|---|---|
| 4,112,502 | A * | 9/1978 | Scheuneman | 714/5 |
| 4,625,273 | A * | 11/1986 | Woffinden et al. | 714/45 |
| 4,852,100 | A * | 7/1989 | Christensen et al. | 714/763 |
| 5,604,753 | A * | 2/1997 | Bauer et al. | 714/763 |
| 5,630,055 | A * | 5/1997 | Bannon et al. | 714/52 |
| 5,847,577 | A * | 12/1998 | Trimberger | 326/38 |
| 5,914,616 | A | 6/1999 | Young et al. | |
| 5,961,655 | A * | 10/1999 | Johnson et al. | 714/48 |
| 6,101,624 | A * | 8/2000 | Cheng et al. | 714/736 |
| 6,800,884 | B1 * | 10/2004 | Feng et al. | 257/209 |
| 6,904,586 | B1 * | 6/2005 | Bemanian et al. | 716/16 |
| 6,919,736 | B1 * | 7/2005 | Agrawal et al. | 326/41 |
| 7,111,224 | B1 * | 9/2006 | Trimberger | 714/764 |
| 7,126,856 | B2 * | 10/2006 | Sun et al. | 365/185.29 |
| 7,187,200 | B2 | 3/2007 | Young | |
| 7,203,842 | B2 * | 4/2007 | Kean | 713/189 |
| 7,328,377 | B1 * | 2/2008 | Lewis et al. | 714/48 |

OTHER PUBLICATIONS

U.S. Appl. No. 10/970,964, filed Oct. 22, 2004, Vadi et al.
U.S. Appl. No. 10/971,220, filed Oct. 22, 2004, Cory et al.
U.S. Appl. No. 11/055,475, filed Feb. 10, 2005, Vadi.
Xilinx, Inc.; "Programmable Logic Data Book 2000"; Apr. 2000; available from Xilinx, Inc., 2100 Logic Drive, San Jose, California 95124; pp. 3-75 through 3-96.
Xilinx, Inc.; "Virtex-II Platform FPGA Handbook"; Published Dec. 2000; available from Xilinx, Inc., 2100 Logic Drive, San Jose, California 95124; pp. 33-75.
Xilinx, Inc.; "Virtex-II Pro Platform FPGA Handbook"; Oct. 14, 2002; available from Xilinx, Inc., 2100 Logic Drive, San Jose, California 95124; pp. 19-71.

* cited by examiner

*Primary Examiner*—Stephen M. Baker
(74) *Attorney, Agent, or Firm*—W. Eric Webostad

(57) ABSTRACT

An integrated circuit that accesses memory from data lines in multiple word increments having distributed error correction coding circuitry is described. The data lines are selectively coupled to a portion of the memory for a read of data stored in the portion of the memory. The read includes providing in parallel in the multiple word increments the data stored in the portion of the memory. The data lines are selectively tapped to provide the data from the read to flow in parallel in a first direction and in a second direction. The first direction provides the data to the data registers, and the second direction provides the data to be propagated in an error checking matrix of the distributed error correction coding circuitry.

20 Claims, 7 Drawing Sheets

ERROR CORRECTION FOR MULTIPLE WORD READ

FIELD OF THE INVENTION

One or more aspects of the invention generally relate to error correction and, more particularly, to error correction for configuration memory of a programmable logic device.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.) Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines."

Another such FPGA, the Xilinx Virtex®-II FPGA, is described in detail in pages 33-75 of the "Virtex-II Platform FPGA Handbook", published December, 2000, available from Xilinx, Inc., 2100 Logic Drive, San Jose, Calif. 95124. And yet another such FPGA, the Xilinx Virtex-II Pro™ FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124.

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology.

The terms "PLD" and "programmable logic device" include these exemplary devices, as well as encompassing devices that are only partially programmable. For purposes of clarity, FPGAs are described below though other types of PLDs may be used. FPGAs may include one or more embedded microprocessors. For example, a microprocessor may be located in an area reserved for it, generally referred to as a "processor block."

A frame of configuration memory for an FPGA, which may be an array of configuration random access memory ("RAM") cells, conventionally may be loaded with coded configuration information. For example, a frame of configuration information may be stored in an array of configuration RAM cells which is 1312 bits tall by 1 bit wide, where a portion of these cells, such as 12 bits in the center, may be for error correction. Such 12 centrally located bits may be encoded with a known error correction code, such as a Hamming code for example. These 1312 bits may be read out in parallel to a frame data register, which conventionally is a shift register. Shadow registers may be interposed between the frame data register and the configuration memory to facilitate reading out information from the frame of configuration memory while performing a read or write operation using the frame data register. Configuration information may be shifted in or out of the frame data register in 32 bit increments, such as via a 32-bit wide bus. Continuing the above example, 1312 bits read out of a frame data register 32 bits at a time to bit accumulating error correction circuitry would take 41 clock cycles. If an error is detected, an error-corrected bit and all other bits of the frame may be written back into the configuration memory from which they were obtained. This may involve writing all 1312 bits, including the corrected bit, 32 bits at a time to the frame data register, taking another 41 clock cycles. Additionally, there may be some clock cycles for overhead, such as setting up a read of the frame data register, setting up a write of the frame data register, and error calculation. Thus it should be understood that for configuration memory, error checking is a time-consuming process.

Accordingly, it would be desirable and useful to provide means for error correction for configuration memory that takes less time than conventional error correction.

SUMMARY OF THE INVENTION

One or more aspects of the invention generally relate to an integrated circuit having memory, where the memory is accessed in multiple word increments.

An aspect is an integrated circuit having memory, where the memory is accessed from data lines in multiple group increments, wherein a group is a plurality of bits, for example, a word. The integrated circuit includes first data registers coupled to the data lines. The data lines are selectively coupled to a portion of the memory for a read of data stored in the portion of the memory. The data includes error correction bits. The read includes providing in parallel in the multiple group increments the data stored in the portion of the memory. Distributed error correction coding circuitry is coupled to the data lines. Each of the data lines is tapped to obtain the data from the read of the portion of the memory. The data lines are selectively tapped to provide the data to flow in parallel in a first direction and in a second direction. The first direction provides the data to the first data registers, and the second direction provides the data to be propagated in an error checking matrix of the distributed error correction coding circuitry. Error checking of the data is done inline with the read of the data and not from the data as output from the first data registers.

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
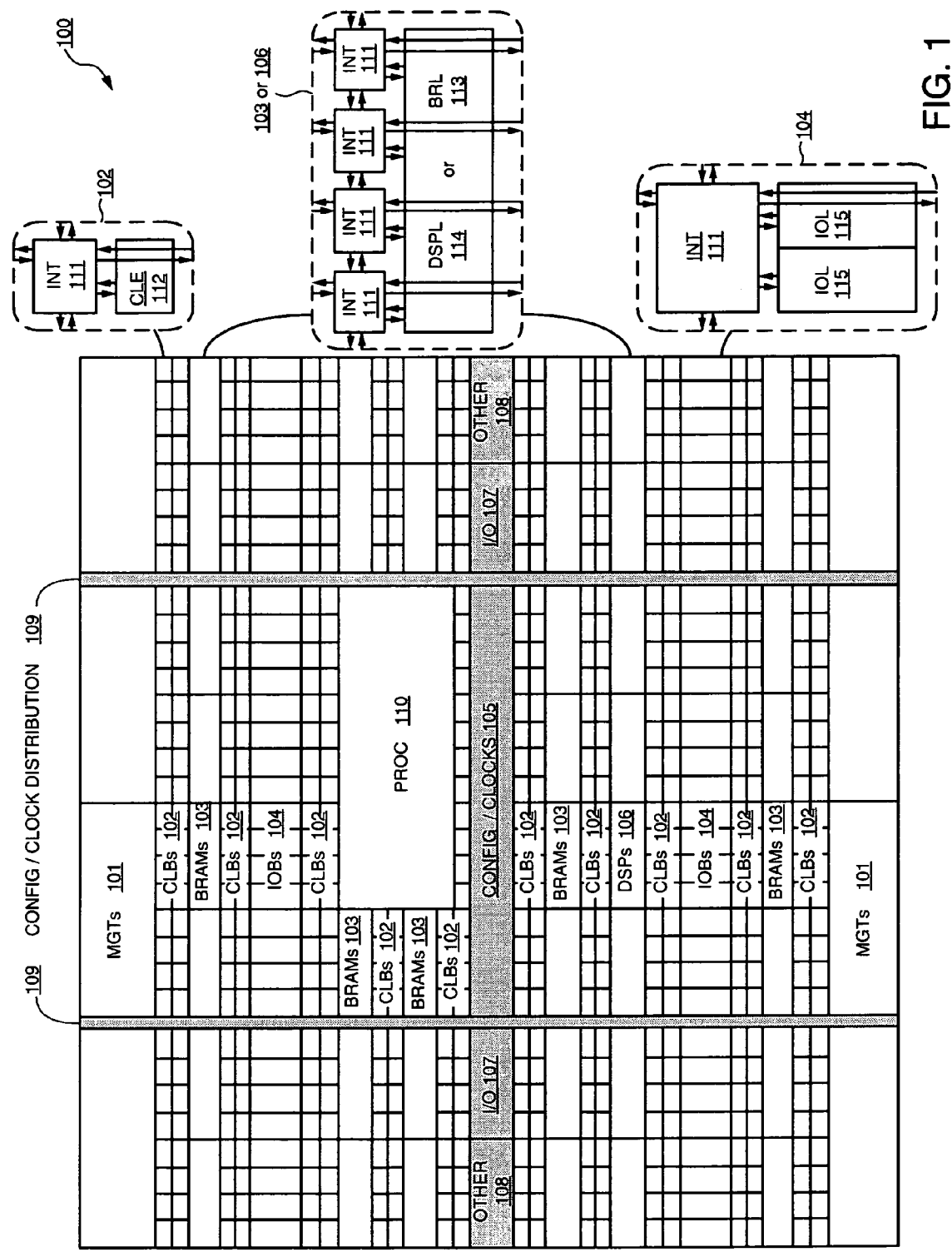
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. Additional details regarding a columnar architected FPGA may be found in a co-pending patent application, namely, U.S. patent application Ser. No. 10/683,944, entitled "Columnar Architecture" by Steve P. Young, filed Oct. 10, 2003.

FPGA 100 illustratively represents a columnar architecture, though FPGAs of other architectures, such as ring architectures for example, may be used. Moreover, it should be understood that FIG. 1 may be associated with a logic plane of FPGA 100, and that there is another plane, namely a configuration plane, of FPGA 100.

Figure 2:
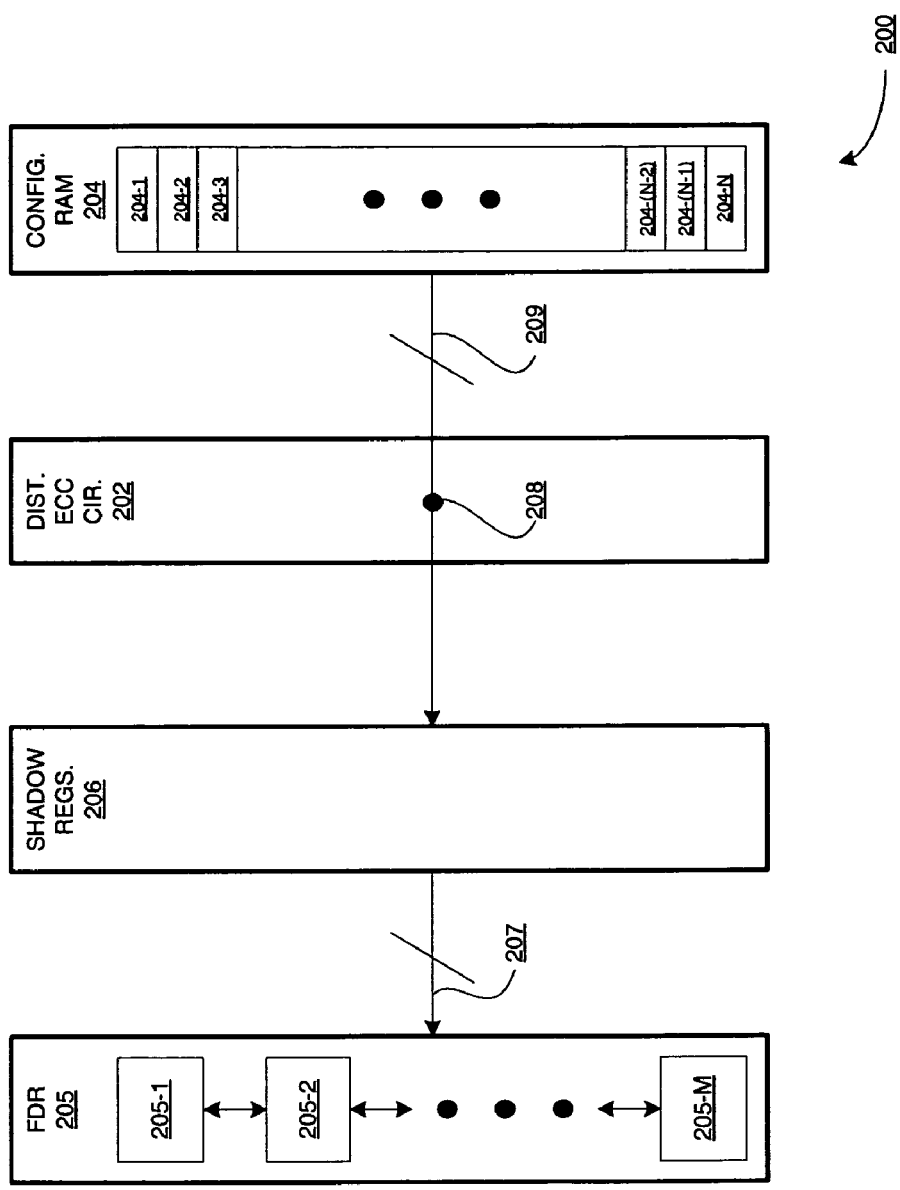
FIG. 2 is a simplified block diagram depicting an exemplary embodiment of a configuration plane of the FPGA of FIG. 1.

FIG. 2 is a simplified block diagram depicting an exemplary embodiment of a configuration plane 200 of FPGA 100 of FIG. 1. Configuration plane 200 includes configuration RAM 204, distributed error correction coding ("ECC") circuitry 202, shadow registers 206, and frame data register ("FDR") 205. Configuration RAM 204 includes memory cells 204-1 through 204-N, for N a positive integer. For purposes of clarity by way of example, it shall be assumed that N is equal to 1312, though it should be understood that other values for N may be used. Accordingly, 1312 data lines 209 are used for a parallel readout of information stored in memory cells 204-1 through 204-1312. The parallel readout from configuration RAM 204 may be registered in shadow registers 206, where there is an equivalent number of shadow registers to bits of a frame. Again, in this example, a frame is 1312 bits. Coupled between shadow registers 206 and configuration RAM 204 is distributed ECC circuitry 202, which taps into data lines 209, as described below in additional detail and as generally indicated with node or tap 208. Notably, distributed ECC circuitry 202 may be shared by all configuration RAM of an FPGA, or there may be multiple blocks of distributed ECC circuitry 202, each of which is for an assigned portion of configuration RAM.

Configuration information registered in shadow registers 206 may be output via data lines 207. Data lines 207 are equivalent in number to data lines 209 for a parallel readout of information stored in shadow registers 206 to FDR 205. FDR 205 represents multiple data registers. FDR 205 may be a segmented FDR including FDR segments 205-1 through 205-M, for M a positive integer. Notably, configuration RAM frame 204 represents multiple configuration RAM frames that may be employed in configuration plane 200. Additional details regarding configuration plane 200, including a segmented FDR, may be found in the following co-pending patent applications, each of which is incorporated herein by reference in its entirety: "A Method and System for Configuring an Integrated Circuit," by Vadi et al., assigned U.S. patent application Ser. No. 10/970,964, filed Oct. 22, 2004; and "Bidirectional Register Segmented Data Busing," by Vasisht Mantra Vadi, assigned U.S. patent application Ser. No. 11/055,475, filed Feb. 10, 2005.

As mentioned above, 12 bits stored in the center of a configuration frame may be error correction code bits, such as Hamming code bits, for example. It should be appreciated that by having distributed ECC circuitry 202 interposed between configuration RAM 204 and FDR 205, checking for whether one or more bits needs to be corrected may be done concurrently with a read of configuration RAM 204. This concurrent checking may increase the speed with which error correction checking may be done.

Continuing the example of Hamming code error correction bits, it should be understood that Hamming coding essentially works using matrix multiplication. Briefly, to determine what the 12 error code bits are for a frame, the data vector associated with the configuration data for a frame is multiplied by a Hamming code generator matrix. Output of the Hamming code generator matrix multiplication is a parity code vector, namely the 12 Hamming code bits in this example. This parity code vector is added to the configuration data to provide a configuration data frame vector.

To determine if a bit has inadvertently flipped state in a frame of configuration data, the configuration data frame is read out, for example, to shadow registers 206 from configuration RAM 204. The frame data read out is obtained from this readout by distributed ECC circuitry 202. To determine if any error exists in a configuration data frame, the vector representing the configuration data frame is multiplied by an error checking matrix for the type of encoding used, which in this example, would therefore be a Hamming code error checking matrix. The multiplication of the Hamming code error checking matrix with the data frame vector may be implemented by multiplying row input of configuration data, such as via data lines 209, with column forward propagation of exclusive ORing to effectively obtain an output representing a multiplication of the two matrices. Notably, the Hamming code error checking matrix will include a Hamming code identity matrix. Notably, it should be understood that 12 bits may be used to error check up to 2048 bits. In this example, there are 1300 bits, or rows, of configuration data, which means that the counting space from 0 to 2047 has many gaps for allocation of where configuration data is located. This freedom of assignment facilitates row data assignment, meaning that every row may be an inversion of the previous row for the purposes of the Hamming code error checking matrix exclusive of the Hamming code identity matrix located therein. In other words, each bit that comes out of configuration memory goes to at least one exclusive OR ("XOR") gate in order to perform the error checking matrix multiplication. Thus, in this example, the result of the Hamming error checking code matrix multiplication is a 12-bit-wide syndrome value.

Accordingly, each configuration bit of a configuration data frame is tapped off for input into some number of XOR gates, from 1 to 12 in this example, which will depend on the value of the Hamming code identity matrix, namely it will depend on the number of Hamming code bits embedded in the configuration data frame. The value in each row of a Hamming code identity matrix will vary from application to application. However, for example, suppose the row had 12 places or columnar relations with the following values: 011011011010. The zero values would indicate there is no connection to an XOR gate for this row, and the logic ones would indicate that there is a connection to an XOR gate for this row. The next row of a pair of rows would have the inverted value of its associated row, namely the adjacent and associated row in this example would have the following values: 100100100101.

Thus, by knowing the XOR connectivity to a row, the XOR connectivity to another row of a pair is known. However, it should be appreciated that this is only applicable for pairs, and thus a row adjacent to another row which is not a complementary pair row would not provide a priori information regarding the XOR connectivity. Additional information regarding syndrome decoding and syndrome bits may be found in a co-pending application entitled "Error Checking Parity and Syndrome of a Block of Data with Relocated Parity Bits," by Warren Eugene Cory et al., assigned U.S. patent application Ser. No. 10/971,220, filed Oct. 22, 2004, which is incorporated by reference herein in its entirety.

Figure 3A:
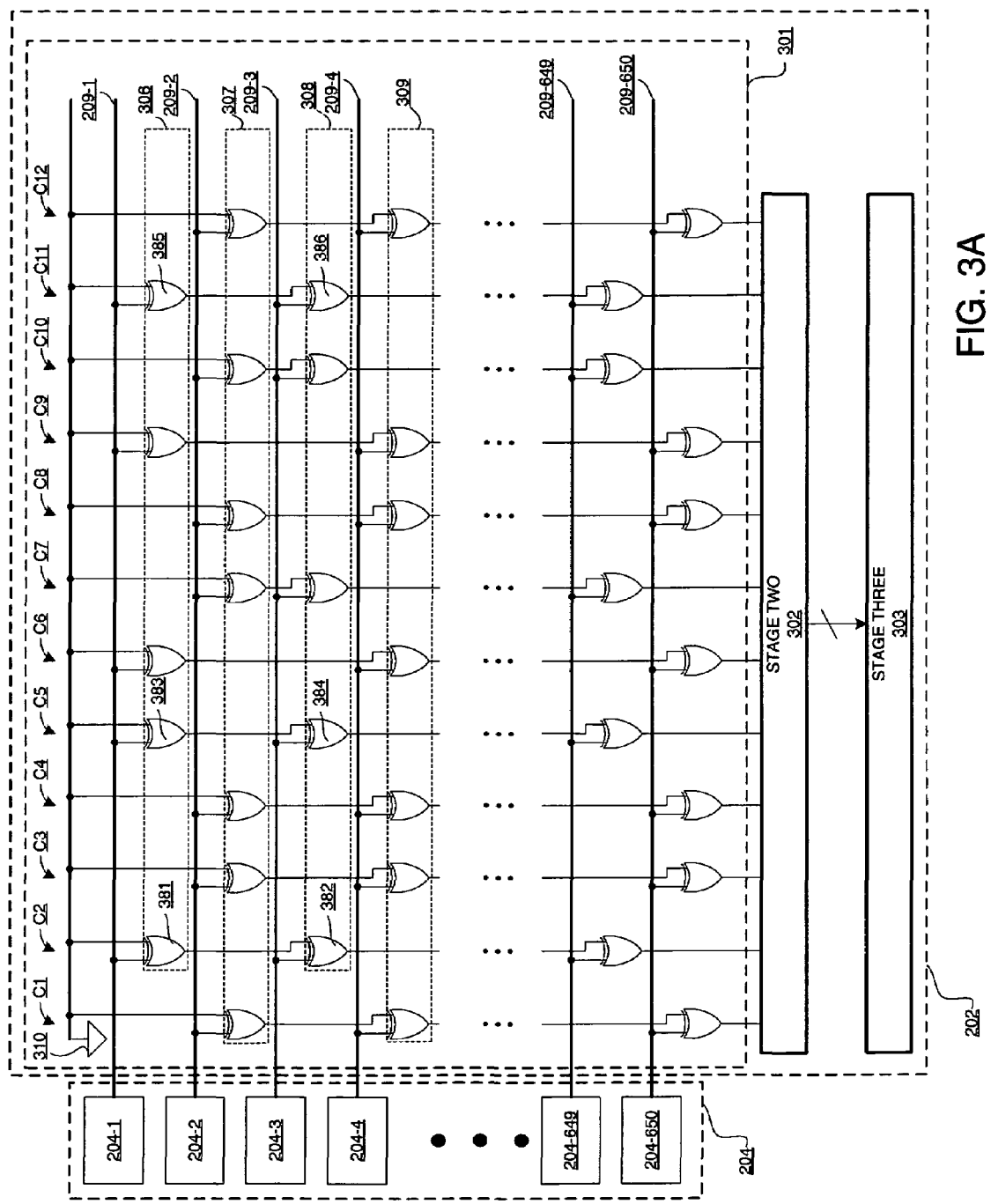
FIGS. 3A through 3D are block/schematic diagrams depicting an exemplary embodiment of portions of configuration random access memory ("RAM") cells coupled to distributed error correction coding ("ECC") circuitry.

FIG. 3A is block/schematic diagram depicting an exemplary embodiment of a portion of configuration RAM 204 coupled to distributed ECC circuitry 202. Memory cells 204-1 through 204-650 are respectively coupled to data lines 209-1 through 209-650. Distributed ECC circuitry 202 is coupled to data lines 209-1 through 209-650 via columns generally denoted as C1 through C12. Memory cells 204-1 and 204-2 are coupled to at least one of columns C1 through C12 in this exemplary embodiment. More particularly, memory cell 204-1 via data line 209-1 is respectively coupled to an XOR gate input of XOR gates 306, namely XOR gates associated with columns C2, C5, C6, C9, and C11. The other input of each XOR gate of XOR gates 306 is coupled to ground 310. Memory cell 204-2 is coupled via data line 209-2 to XOR gates 307 as associated with columns C1, C3, C4, C7, C8, C10, and C12. The other input of each XOR gate of XOR gates 307 is coupled to ground 310. Thus it should be understood that the set of XOR gates 306 is a complementary set to the set of XOR gates 307, as previously described with respect to memory cell data line pairs, where coupling to an XOR gate indicates a logic one value, and the absence of a coupling to an XOR gate indicates a logic zero value, with respect to multiplication inputs of a row of an error checking matrix. Thus it should be understood that data lines 209-1 through 209-650 may be associated with respective rows of Hamming code error checking matrix.

Memory cell 204-3 is coupled to columns C2, C5, C7, C10, and C11 via data line 209-3 for providing input to XOR gates 308. The other inputs of XOR gates 308 are coupled to respective outputs of either XOR gates 306 or XOR gates 307. For example, an input of an XOR gate 382 is coupled to an output of XOR gate 381, an input of XOR gate 384 is coupled to an output of XOR gate 383, and an input of XOR gate 386 is coupled to an output of XOR gate 385. Notably, XOR gates 381, 383, and 385 are part of part of XOR gates 306, and XOR gates 382, 384, and 386 are part of XOR gates 308. The remainder of XOR gates in the set of XOR gates 308 have their other inputs coupled to outputs of XOR gates in the set of XOR gates 307. It should be understood that the pattern of complementary connections between pairs of data lines is not necessarily identical for an adjacent pair of data lines. Thus, for example, memory cell 204-4 is coupled to the set of XOR gates 309 via data line 209-4, which is a complementary set of couplings for positions of the set of XOR gates 308 but not with respect to the set of XOR gates 307 or 306 in this example. For this example, coupling to data lines 209-1 through 209-650 is for a first matrix portion of a Hamming code error checking matrix, namely stage one 301. Because stage one is a starting stage, an initial pair of data line inputs is XORed with a fixed logic level, such as ground 310 in this example. Subsequent pairs of data line inputs use output from a prior pair of data inputs multiplied in the form of XORing. Thus it should be appreciated that memory cells 204-1 through 204-650 represent storage of a portion of a configuration frame data vector which is multiplied by a portion of a Hamming code error checking matrix formed as a matrix of XOR gates, namely stage one 301. Output of stage one 301 is provided as input to stage two 302.

Figure 3B:
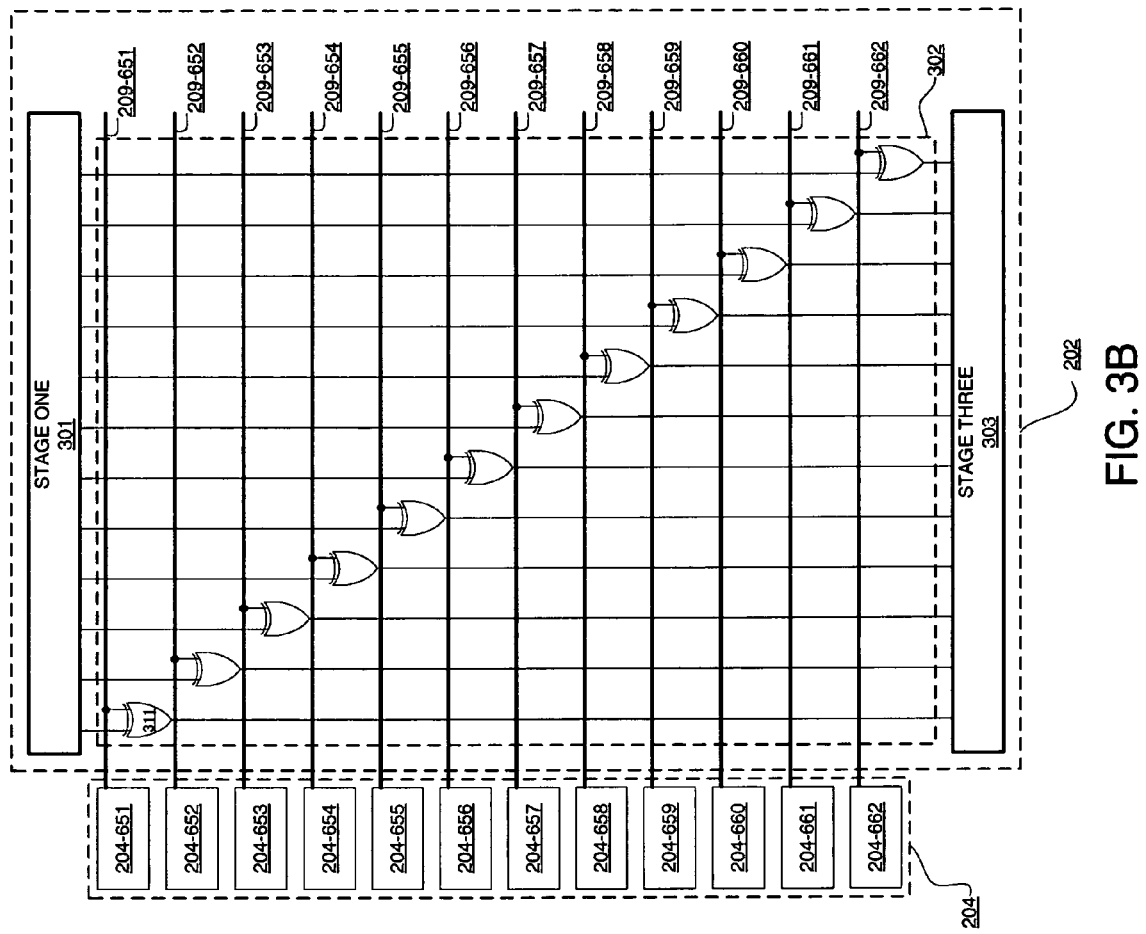

Continuing the above example, 12 bits in the center of a frame of configuration data are Hamming code bits. FIG. 3B is a block/schematic diagram depicting an exemplary embodiment of a Hamming code bit portion of configuration RAM 204 coupled to distributed ECC circuitry 202. Memory cells 204-651 through 204-662 each store a Hamming code bit for error correction of configuration data stored in configuration memory cells 204-1 through 204-650 of FIG. 3A and memory cells 204-663 through 204-1312 of FIG. 3C. Notably, error correction bits may be stored anywhere within a configuration data frame; however, it may be more convenient to store all such error correcting bits together. Output of C1 from stage one 301 is provided as an input to XOR gate 311. Output of memory cell 204-651 is coupled via data line 209-651 to another input of XOR gate 311. The output of XOR gate 311 is provided to stage three 303. This is repeated for each output of memory cells 204-652 through 204-662, where there is a single column and single XOR gate coupled to provide an output to stage three 303. Thus, stage two 302 includes a respective XOR gate for each associated data line 209-651 through 209-662, where such data lines 209-651 through 209-662 are respectively coupled to the output of memory cells 204-651 through 204-662. In other words, stage two 302 provides a Hamming code identity matrix of a Hamming code error checking matrix. Outputs of stage two 302 are respectively provided to stage three 303. In this example, there are 12 Hamming code bits, and thus there are 12 columns in order to form an identity matrix using 12 respective XOR gates.

Figure 3C:
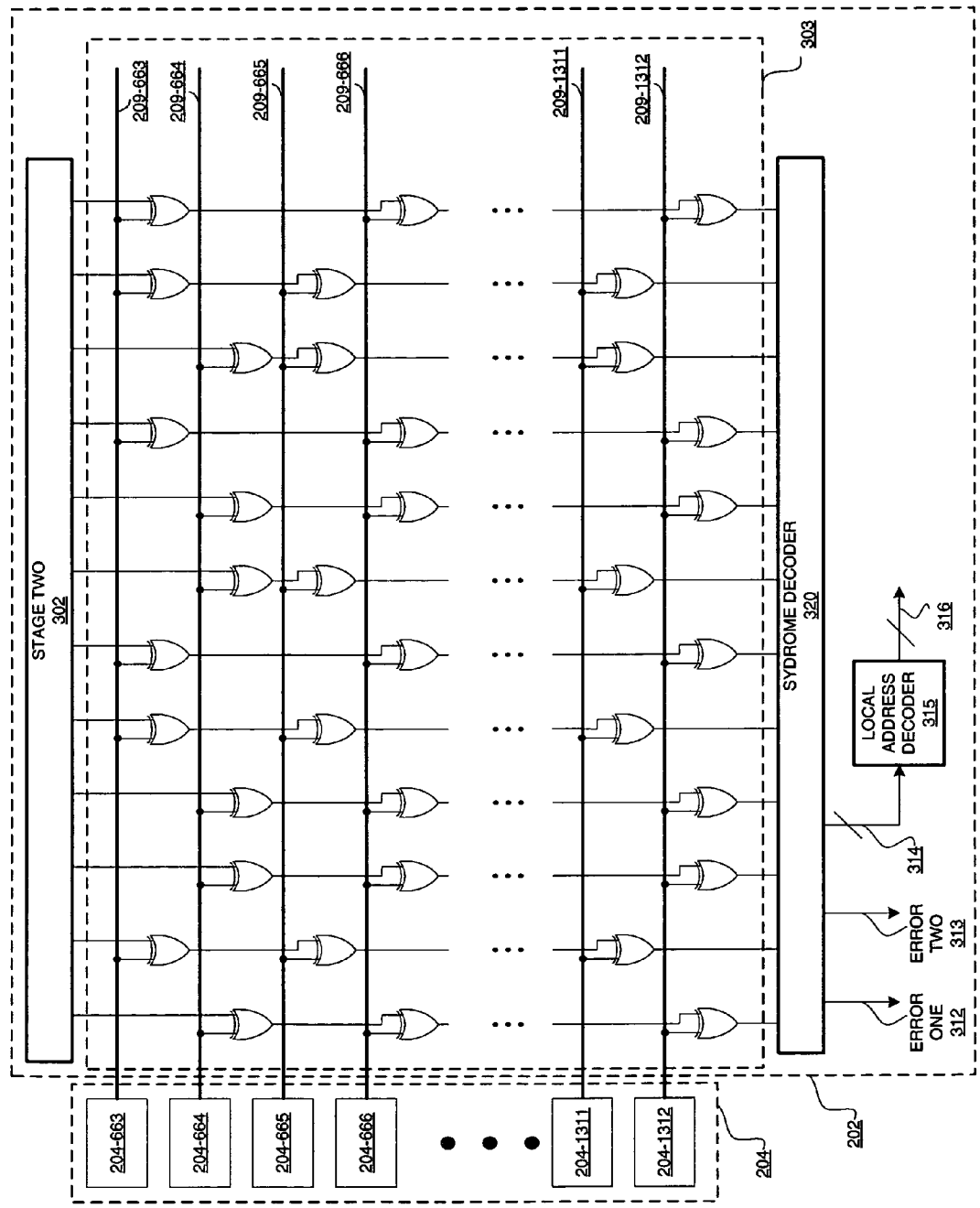

FIG. 3C is a block/schematic diagram depicting an exemplary embodiment of a portion of configuration RAM 204 coupled to distributed ECC circuitry 202. Output of stage two 302 is provided as input to stage three 303, where stage three 303 is another portion of the Hamming code error checking matrix. Referring back to FIG. 3A, it should be understood that other than initially having ground provide input to a first pair of complementary data line inputs, stage one 301 and stage three 303 have a similar description, which is not repeated here for purposes of clarity. Thus output of stage two 302 provides initial input for XOR gates coupled to a first complementary pair of data lines 209-663 and 209-664, where the other input of such XOR gates is coupled to output of either memory cell 204-663 or memory cell 204-664. Memory cells 204-663 through 204-1312 store another portion of a configuration data vector which is multiplied by the matrix provided by XOR gates of stage three 303. The output of stage three 303 is provided to a syndrome decoder 320. In other words, the output of stage three 303 is a syndrome value which indicates whether or not any bit or bits in a frame of configuration data stored in configuration RAM 204 have been erroneously flipped, thereby causing an error. Output of syndrome decoder 320 may be error one signal 312, error two signal 313, or address signal 314. Address signal 314 may be an address of suitable length for identifying a particular one of memory cells 204-1 through 204-1312, more generally a memory cell of a frame of memory cells. In this example, address signal 314 is a 12-bit-wide signal which is provided to a local address decoder 315. Output of local address decoder 315 is an address signal 316 for accessing one of memory cells 204-1 through 204-1312 to indicate which of those cells has an erroneously flipped bit. Of course, this assumes that an error was detected. If no error is detected, there is no address to decode. Therefore, if error one signal 312 is asserted, meaning that a single bit error was detected, then such address would be decoded. If, however, error one signal 312 is not asserted, then there would be no address to decode. Moreover, if there is more than a single bit error, meaning that error two signal 313 is asserted, then it is not possible to identify a particular address for correcting a single bit error, as is known, and a frame of configuration data would have to be reloaded to resolve the error. Thus, in this latter example, no local address decoding would be done.

Accordingly, row input from memory is provided in multiple word increments, such that an entire frame is read in a single parallel read operation. This row input is tapped to provide columnar input along with an initial input from a fixed logic level. This columnar input is used to generate additional columnar input from the output of gates, all of which propagates down the columns. It should be understood that though signal propagation delay of data from, for example, ground 310 of stage one 301 through each of columns C1 through C12 until output of stage three 303 takes time, it is at least four times faster than prior error identification as described elsewhere herein. Moreover, because shadow registers 206 facilitate shifting at the same time information is shifted in or out of FDR 205, timely identification of whether there is a single or more bit error in a frame of data is facilitated.

Figure 3D:
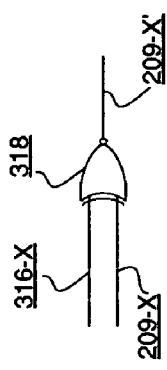

FIG. 3D is a schematic diagram depicting an exemplary embodiment of circuitry which may be used for error correction of a signal bit error. An input 209-X to XOR gate is data on a selected data line of data lines 209-1 through 209-1312, where such selected data line is associated with a memory cell 204-X of memory cells 204-1 through 204-1312 having the erroneously flipped bit stored therein. Input 316-X is a bit signal from local address decoder 315 of FIG. 3C asserted responsive to detection of an error at that location. For example, if an error is detected in a memory cell 204-X, then input 316-X will be a logic 1 which forces output 209-X of 204-X to drive the inverted (repaired) value of 204-X. Output of XNOR gate 318 is provided as a data line output 209-X' to provide a corrected bit value for the prior data input.

Figure 4:
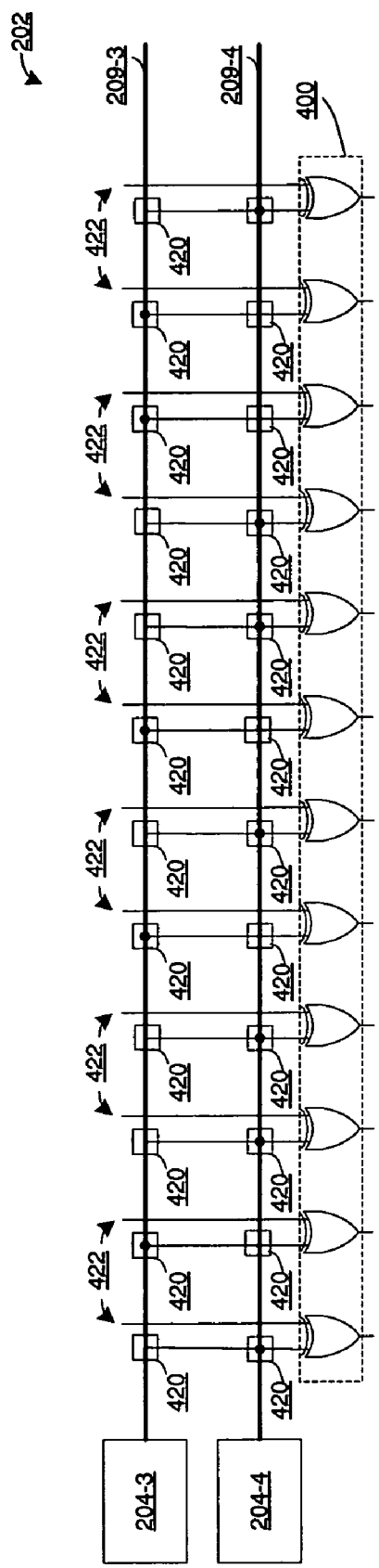
FIG. 4 is a block/schematic diagram depicting an exemplary alternative embodiment of a portion of distributed ECC circuitry.

FIG. 4 is a block/schematic diagram depicting an exemplary alternative embodiment of a portion of a stage one 301 of distributed ECC circuitry 202. Though output of memory cells 204-3 and 204-4 is illustratively shown in FIG. 4, it should be understood than any of the array of XOR gates of distributed ECC circuitry 202 may use the architecture of FIG. 4. Each input 422, such as from either a prior stage or a prior multiplication by XORing of multiplied data vectors, or from a fixed logic level such as ground, is provided to a row of XOR gates 400. So, rather than staggering XOR gates as previously described, XOR gates for a data line pair may be provided in a single row which facilitates a denser layout. XOR gates 400 may be respectively connected to data lines, which in this example are data lines 209-3 and 209-4, through programmable interconnect points, namely option cells 420. Notably, option cells 420, which are activated to provide a connection, are indicated in FIG. 4 by showing a connection node to a data line, either data line 209-3 or 209-4 in this example. Thus it should be appreciated that rows of XOR gates and associated option cells may be used to provide a programmably configurable Hamming code error checking matrix.

Figure 5:
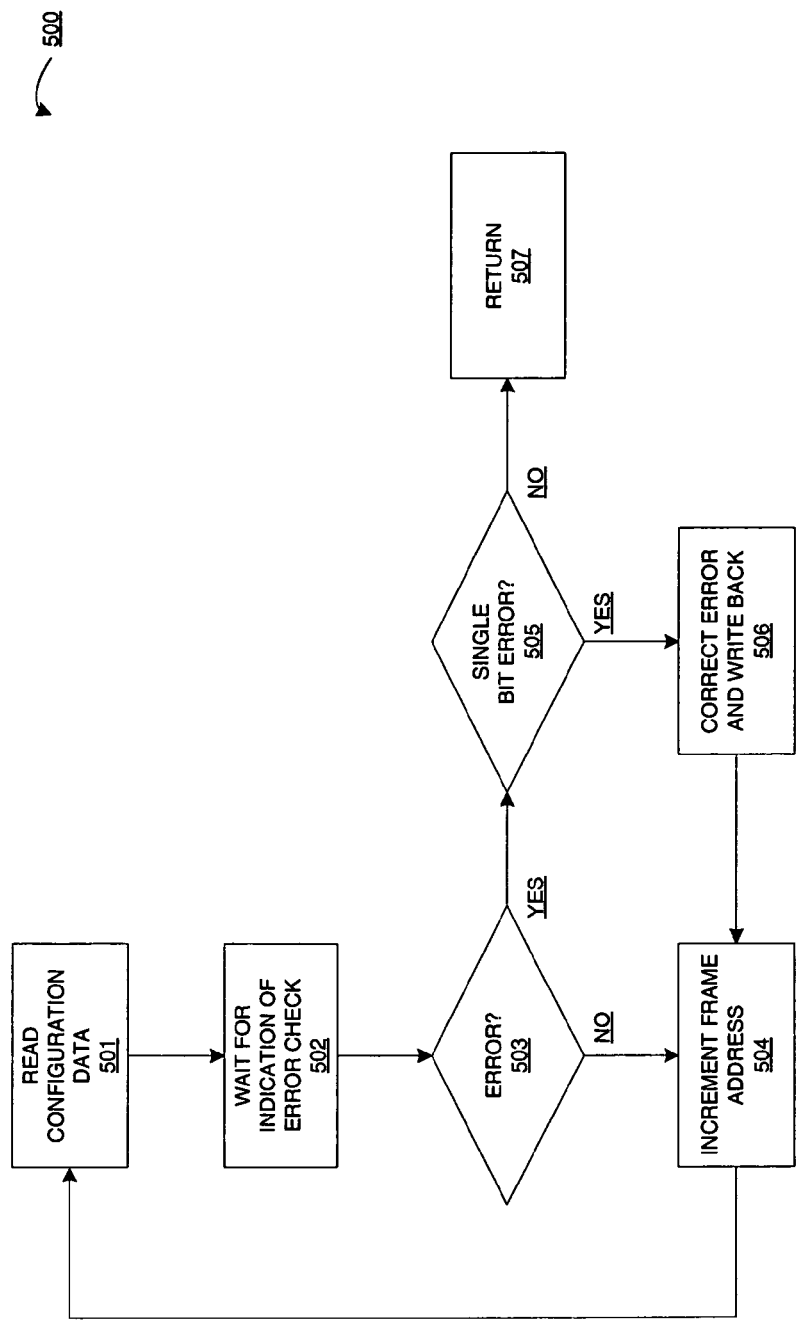
FIG. 5 is a flow diagram depicting an exemplary embodiment of a state machine flow 500 for control of distributed ECC circuitry.

FIG. 5 is a flow diagram depicting an exemplary embodiment of a state machine flow 500 for control of distributed ECC circuitry 202. At 501, configuration data is read from configuration RAM. Notably, there may be multiple states for such a read, as it takes a certain number of cycles, depending on clock frequency, to read an entire frame of data. Moreover, reading of configuration data at 501 further includes precharging of read data lines and allowing of propagation of information down the columns of distributed ECC circuitry 202. Thus, at 502, there is a wait state for waiting for an indication of whether an error check has been completed. After an error check has been completed, then at 503 it is determined whether an error has been detected. If no error is detected, there is no reason for error correction of such a frame of data just having been checked for an error. Thus, at 504, the frame address may be incremented to obtain another frame of configuration data to be error checked. Thus, from 504 the frame data associated with the incremented frame address may be obtained at 501. Notably, states associated with incrementing of a frame address 504 may include de-assertion of the current address line, incrementing the frame address, waiting for the frame address to propagate, and reasserting the address lines.

If an error is detected at 503, then at 505 it is determined whether it is a single bit error. As previously mentioned, only single bit errors may be individually corrected in contrast to reloading an entire frame of configuration data. If the error detected is a single bit error, then at 506 such single bit error is corrected and written back to the current frame of configuration data at the location identified for such an error. Writing back configuration data including a corrected bit at 506 may take multiple write states, as multiple clock cycles of a clock may lapse during such a write back operation. From 506, the frame address may be incremented at 504, and state machine flow 500 may proceed as previously described. If, however, the error is greater than a single bit error as determined at 505, such as a double bit or larger bit error, state machine flow 500 returns at 507 in order for frame configuration data to be reloaded, such as in a known manner. Notably, a state machine associated with state machine flow 500 may be added to an existing configuration state machine of FPGA 100 of FIG. 1, where state machine flow 500 is used to control cycling through each frame of configuration frame data stored in FPGA 100 to check for any errors.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit having memory, the memory accessed from data lines in multiple group increments, wherein a group has a plurality of bits, the integrated circuit comprising:
    first data registers coupled to the data lines, the data lines selectively coupled to a portion of the memory for a read of data stored in the portion of the memory, the data including error correction bits, the read including providing in parallel in the multiple group increments the data stored in the portion of the memory;
    distributed error correction coding circuitry coupled to the data lines, each of the data lines being tapped to obtain the data from the read of the portion of the memory, the data lines being selectively tapped to provide the data to flow in parallel in a first direction and in a second direction, the first direction to provide the data to the first data registers, the second direction to provide the data to be propagated in an error checking matrix of the distributed error correction coding circuitry; and
    wherein error checking of the data is done inline with the read of the data and not from the data as output from the first data registers.

2. The integrated circuit according to claim 1, wherein each of the data lines is coupled to a respective row of the error checking matrix, and wherein each tap of the data lines is associated with a respective column of the error checking matrix tapped for columnar propagation of the data in the second direction.

3. The integrated circuit according to claim 2, wherein the error checking matrix is coupled to a fixed logic level to provide an initial columnar input to the error checking matrix.

4. The integrated circuit according to claim 3, wherein the error checking matrix includes gates selectively coupled to the data lines and to each other to provide for other columnar input to the error checking matrix, a first portion of the gates selectively coupled to the fixed logic level.

5. The integrated circuit according to claim 4, wherein the gates are selectively coupled to the data lines responsive to implementation of an error identification matrix for multiplication of the data obtained from the read with the error identification matrix.

6. The integrated circuit according to claim 5, wherein the gates for each pair of data lines are laid out in a row.

7. The integrated circuit according to claim 5, wherein the gates are selectively coupled by programming programmable interconnects.

8. The integrated circuit according to claim 5, wherein the error identification matrix is for a Hamming code, and wherein the error correction bits are Hamming code bits.

9. The integrated circuit according to claim 5, wherein output of the error checking matrix is a syndrome value, the error checking matrix coupled to a syndrome decoder to provide the syndrome value thereto.

10. The integrated circuit according to claim 5, further comprising second data registers coupled between the first data registers and the distributed error correction coding circuitry, the first data registers forming a frame data register, and the second data registers being shadow registers, wherein the memory is configuration memory for programmably configurable logic.

11. The integrated circuit according to claim 10, wherein the integrated circuit is a Programmable Logic Device.

12. The integrated circuit according to claim 5, wherein the error identification matrix comprises an identity matrix formed from a second portion of the gates respectively coupled to receive the error correction bits, wherein each gate of the second portion of the gates receives a respective bit of the error correction bits.

13. The integrated circuit according to claim 12, wherein the first portion of the gates and the second portion of the gates are the same.

14. The integrated circuit according to claim 12, wherein the initial columnar input is provided to a first set of gates and a second set of gates of the error checking matrix, other inputs to the first set of gates and the second set of gates respectively being from a first set of taps and a second set of taps of the data lines, the first set of gates coupled to a first data line of the data lines via the first set of taps, the second set of gates coupled to a second data line of the data lines via the second set of taps, and the first set of taps being an inverse of the second set of taps with respect to columns of the error checking matrix.

15. The integrated circuit according to claim 14, wherein output from the first set of gates and the second set of gates is inversely provided as input to a third set of gates and a fourth set of gates, and wherein other input to the third set of gates and the fourth set of gates is respectively from a third set of taps and a fourth set of taps, the third set of taps coupling the third set of gates to a third data line of the data lines, the fourth set of taps coupling the fourth set of gates to a fourth data line of the data lines, and the third set of taps being an inverse of the fourth set of taps with respect to the columns of the error checking matrix.

16. The integrated circuit according to claim 15, wherein the fixed logic level is ground.

17. The integrated circuit according to claim 16, wherein the gates are exclusive OR gates.

18. The integrated circuit according to claim 17, wherein the error correction bits are contiguously stored in the data.

19. An integrated circuit having memory, the memory accessed from data lines in multiple word increments, the integrated circuit comprising:

frame data register means coupled to the data lines, the data lines selectively coupled to a portion of the memory for a read of data stored in the portion of the memory, the data including error correction means, the read including providing in parallel in the multiple word increments the data stored in the portion of the memory; and distributed error correction coding means coupled to the data lines, each of the data lines being tapped to obtain the data from the read of the portion of the memory, the data lines being selectively tapped to provide the data to flow in parallel in a first direction and in a second direction, the first direction to provide the data to the first data registers, the second direction to provide the data to be propagated in an error checking means of the distributed error correction coding means, the error checking means configured with an error identification means, the error identification means including an identity means associated with the error correction means;

wherein error checking of the data is done inline with the read of the data and not from the data as output from the frame data register means.

20. The integrated circuit according to claim 19, wherein the memory is configuration memory for programmably configurable logic, and wherein the integrated circuit is a Field Programmable Gate Array.

\* \* \* \* \*